United States Patent
Geshel et al.

(10) Patent No.: US 9,401,013 B2
(45) Date of Patent: Jul. 26, 2016

(54) METHOD OF DESIGN-BASED DEFECT CLASSIFICATION AND SYSTEM THEREOF

(71) Applicant: Applied Materials Israel Ltd., Rehovot (IL)

(72) Inventors: Mark Geshel, Kfar-Saba (IL); Zvi Goren, Nes-Ziona (IL); Efrat Rozenman, Aseret (IL)

(73) Assignee: Applied Materials Israel, Ltd., Rehovot (IL)

( * ) Notice: Subject to any disclaimer, the term of this patent is extended or adjusted under 35 U.S.C. 154(b) by 318 days.

(21) Appl. No.: 13/756,462

(22) Filed: Jan. 31, 2013

(65) Prior Publication Data

US 2014/0212022 A1    Jul. 31, 2014
US 2015/0356719 A9    Dec. 10, 2015

Related U.S. Application Data

(60) Provisional application No. 61/594,952, filed on Feb. 3, 2012.

(51) Int. Cl.

| | |
|---|---|
| *G06K 9/00* | (2006.01) |
| *G06F 19/00* | (2011.01) |
| *G06T 7/00* | (2006.01) |
| *G01R 31/26* | (2014.01) |
| *G01R 31/28* | (2006.01) |
| *H01L 21/66* | (2006.01) |

(52) U.S. Cl.
CPC ............ *G06T 7/0004* (2013.01); *G01R 31/26* (2013.01); *G01R 31/2894* (2013.01); *G06T 7/001* (2013.01); *G06T 7/0006* (2013.01); *G06T 2207/30148* (2013.01); *H01L 22/12* (2013.01)

(58) Field of Classification Search
CPC .............. G01R 31/26; G01R 31/2894; G06T 2207/30148; G06T 7/0006; G06T 7/001; G06T 7/00; G06T 7/0004; H01L 22/12; G06K 9/183; G06K 7/14; G06K 1/121; G06K 9/32; G06K 19/06028; G01N 21/95607; G01N 21/9501

USPC .............. 382/100, 141, 145, 149; 700/90, 95, 700/110, 121, 117, 108, 109; 702/20, 59, 702/83, 57, 58; 716/52, 50, 51; 356/237.2, 356/237.1, 237.3; 348/126, 125, 128

See application file for complete search history.

(56) References Cited

U.S. PATENT DOCUMENTS

| | | | |
|---|---|---|---|
| 7,570,796 B2* | 8/2009 | Zafar | G03F 1/84 382/144 |
| 7,570,800 B2* | 8/2009 | Lin | G06T 7/001 382/149 |
| 7,877,722 B2* | 1/2011 | Duffy et al. | 716/55 |
| 7,937,179 B2* | 5/2011 | Shimshi | G05B 19/41875 382/145 |
| 8,041,103 B2* | 10/2011 | Kulkarni | G06F 17/5045 382/144 |
| 8,139,843 B2* | 3/2012 | Kulkarni et al. | 382/144 |
| 2013/0318485 A1 | 11/2013 | Park et al. | |
| 2014/0050389 A1 | 2/2014 | Mahadevan et al. | |

* cited by examiner

*Primary Examiner* — Sheela C Chawan
(74) *Attorney, Agent, or Firm* — Lowenstein Sandler LLP

(57) ABSTRACT

There is provided an inspection method capable of classifying defects detected on a production layer of a specimen. The method comprises: obtaining input data related to the detected defects; processing the input data using a decision algorithm associated with the production layer and specifying two or more classification operations and a sequence thereof; and sorting the processed defects in accordance with predefined bins, wherein each bin is associated with at least one classification operation, wherein at least one classification operation sorts at least part of the processed defects to one or more classification bins to yield finally classified defects, and wherein each classification operation, excluding the last one, sorts at least part of the processed defects to be processed by one or more of the following classification operations.

22 Claims, 7 Drawing Sheets

| Step | Algorithm | Input Class Code | Result Class Code | NoClass Class Code |
|---|---|---|---|---|
| 401 | Library match | 10 | 2001-2999 | 2000 |
| 402 | CDA | 2000 | 3001, 3002, 3003, 3100 | 4000 |
| 403 | DRC1+CDA | 3001 | 4001 | 4000 |
| 404 | DRC2+CDA | 3002 | 4002 | 4000 |
| 405 | DRC3+CDA | 3003 | 4003 | 4000 |
| 406 | DBB | 4000 | Dbb1-Dbb999 | 5000 |

Figure 5

METHOD OF DESIGN-BASED DEFECT CLASSIFICATION AND SYSTEM THEREOF

CROSS-REFERENCES TO RELATED APPLICATIONS

This application claims priority from U.S. provisional patent application No. 61/594,952 filed Feb. 3, 2012 and incorporated herein by reference in its entirety.

FIELD OF THE INVENTION

This invention relates to wafer inspection tools and methods of operating thereof and, in particular, to methods and systems for design-based defect classification.

TECHNICAL BACKGROUND

In the semiconductor industry, devices are fabricated by a number of manufacturing processes producing structures of an ever-decreasing size. Thus, such processes as inspection, metrology and alike (referred to hereinafter as inspection processes) require increased precision and effectiveness for manufacturing specimens. The term "specimen" used in this specification should be expansively construed to cover any kind of wafer, reticle and other structures, combinations and/or parts thereof used for manufacturing semiconductor integrated circuits, magnetic heads, flat panel displays, and other thin film devices.

Inspection processes can include recognition of structural elements, measuring, calibration, monitoring, inspection, reporting and/or other procedures necessary for evaluating parameters and/or conditions of respective manufacturing processes and providing necessary feedback. A variety of inspection tools can be based on non-destructive observations as, by way of non-limiting example, scanning electron microscopes, atomic force microscopes, optical inspection tools, etc. Inspection processes are important for debugging specimen manufacturing processes, monitoring process variations, improving production yield, etc.

With shrinking design rules (28 nm and below), the amount of defect-related data reported by a high-sensitivity inspection tools is extremely large (e.g. several thousand defects per wafer). In addition, adoption of new manufacturing processes (e.g. immersion lithography, resist shrinking, resist trimming, etc.) introduces new types of errors resulting from different proximity effects (optical, CMP, chemical, 3D, etc.) and reported by inspection tools as defects. The severities of reported defects can vary from disastrous impacts on product yields to trivial anomalies with no effect on product quality.

Thus, there is a need to classify the reported defects and to separate defects of interest (DOI) from defects that are considered nuisances. As manufacture control requirements become more challenging, classification of reported defects has also become highly complex and time and processing power consuming.

Problems of classifying defects during a fabrication process have been recognized in the conventional art and various techniques have been developed to provide solutions.

One of the typical approaches is analyzing predefined attributes of the defect (e.g. size, magnitude, orientation, shape, etc.) and performing classification based on these attributes. Other classification techniques consider also positioning of the reported defects in the specimen (e.g. with regard to certain defined regions).

The defects can be classified based on one or more attributes of the defect and one or more attributes of the one or more patterned features formed on the specimen proximate to the defect. In such a manner, the defects can be classified based not only on the attribute(s) of the defects, but also on the attribute(s) of any patterned features located on the specimen proximate to the defect.

The defects can be further classified using various methods for utilizing design data in combination with inspection data.

GENERAL DESCRIPTION

In accordance with certain aspects of the presently disclosed subject matter, there is provided a computer-implemented method for classifying defects detected on a production layer of a specimen. The method comprises using a computer to perform the following steps of: obtaining input data related to the detected defects; processing the input data using a decision algorithm associated with the production layer and specifying two or more classification operations and a sequence thereof; sorting the processed defects in accordance with predefined bins, wherein each bin is associated with at least one classification operation, wherein at least one classification operation sorts at least part of the processed defects to one or more classification bins to yield finally classified defects, and wherein each classification operation, excluding the last one, sorts at least part of the processed defects to be processed by one or more of the following classification operations; and storing at least finally classified defects in a storage medium.

In accordance with other aspects of the presently disclosed subject matter, there is provided an inspection system capable of classifying defects detected on a production layer of a specimen. The inspection system comprises a classification unit operatively coupled to at least one inspection tool and to a design data storing unit, wherein the classification unit comprises a defect data interface configured to obtain defect-indicative data from the at least one inspection tool; a design data interface configured to obtain design-indicative data from the design data storing unit; a memory configured to store finally classified defects; and a processor configured to process the defect-indicative data and the design-indicative data using a decision algorithm associated with the production layer and specifying two or more classification operations and a sequence thereof; the processor is further configured to sort the processed defects in accordance with predefined bins. Each bin is associated with at least one classification operation; wherein at least one classification operation sorts at least part of the processed defects to one or more classification bins to yield finally classified defects; and wherein each classification operation, excluding the last one, sorts at least part of the processed defects to be processed by one or more of the following classification operations.

In accordance with other aspects of the presently disclosed subject matter, there is provided a classification unit operable in conjunction with an inspection system capable of classifying defects detected on a production layer of a specimen. The classification unit comprises a processor operatively coupled to a memory accessible by the processor and configured to store finally classified defects, wherein the processor is configured to process defect-indicative data and design-indicative data using a decision algorithm associated with the production layer and specifying two or more classification operations and a sequence thereof; the processor is further configured to sort the processed defects in accordance with predefined bins. Each bin is associated with at least one classification operation; wherein at least one classification operation sorts at least part of the processed defects to one or more classification bins to yield finally classified defects; and wherein each classification operation, excluding the last one, sorts at least part of the processed defects to be processed by one or more of the following classification operations.

In accordance with further aspects of the presently disclosed subject matter and, optionally, in combination with any of the above aspects, the defects can be sorted by a current classification operation to be processed by one or more of the following classification operations are sorted to one or more bins associated with the current classification operation and selected from the group comprising: bins corresponding to the defects non-classified by a current classification operation, and removed from the further processing as not matching the classification operations defined by the decision algorithm; bins corresponding to defects recognized by a current operation as designated to a predefined further classification operation and thus to be processed when such predefined classification operation is executed; bins corresponding to defects recognized by the current classification operation as designated to one of the following classification operations and thus to be processed by each next classification operation until further classified. The same defect can be sorted to more than one bin. At least one bin can be associated with at least two classification operations.

In accordance with further aspects of the presently disclosed subject matter and in combination with any of the above aspects, at least one classification operation can sort the processed defects based on matching, for each defect, a dataset indicative of data-types and layers numbers attributes of all polygons in the vicinity of the defect to one or more predefined datasets comprising classification-related instructions associated with combinations of data-type and layer number attributes. At least one classification operation can sort the processed defects using a combination of design rule check (DRC) analyses with classification by design attributes.

In accordance with further aspects of the presently disclosed subject matter and in combination with any of the above aspects, the order of classification operations can be predefined in accordance with at least one of the following:
  decreasing the number of defects designated for processing by each next classification operation;
  increasing the amount of input data sources required for each next classification operation;
  providing a classification operation requiring a large number of defects to be processed for classification decision before classification operations requiring less defects to be processed for classification decision; and
  providing a classification operation requiring a large number of defects to be processed for classification decision after classification operations requiring less defects to be processed for classification decision and configured to sort the appropriate defects to be gathered for processing by the classification operation requiring a large number of defects to be processed for a classification decision.

In accordance with further aspects of the presently disclosed subject matter and in combination with any of the above aspects, design attributes for each of the defects to be processed can be calculated during an inspection scan. Any of CDA, DRC and library match calculations required for the classification operations can be provided during the inspection scan. One or more classification operations comprising design-based binning can be provided after the inspection scan.

BRIEF DESCRIPTION OF THE DRAWINGS

In order to understand the invention and to see how it may be carried out in practice, embodiments will now be described, by way of non-limiting example only, with reference to the accompanying drawings, in which:

FIG. 5 illustrates a non-limiting example of an operations sequence table resulting from parsing the decision tree defined by the template in FIG. 4;

DETAILED DESCRIPTION

Figure 1:
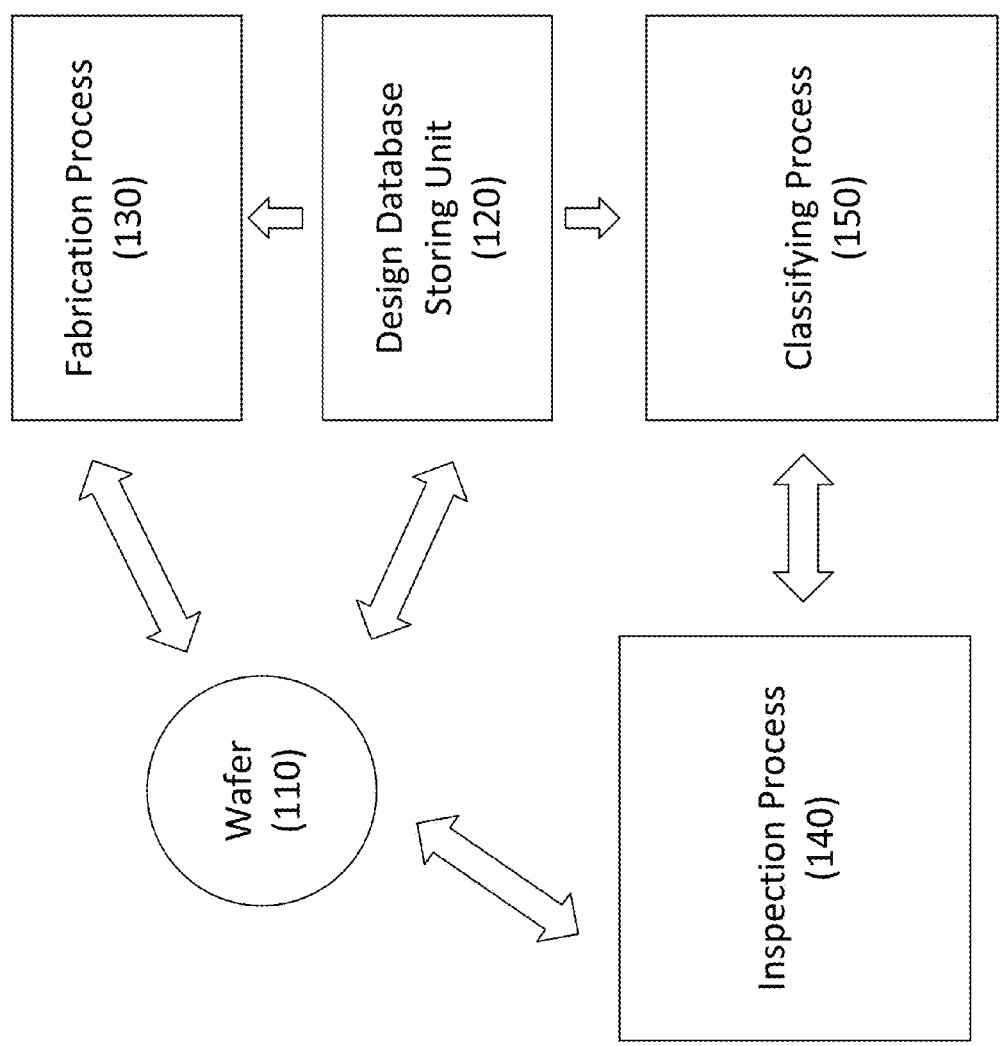
FIG. 1 illustrates an exemplary workflow for a specimen fabrication, in accordance with certain embodiments of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In the drawings and descriptions set forth, identical reference numerals indicate those components that are common to different embodiments or configurations.

Unless specifically stated otherwise, as apparent from the following discussions, it is appreciated that throughout the specification discussions utilizing terms such as "processing", "calculating", "computing", "classifying", "sorting", "matching", "comparing", or the like, include action and/or processes of a computer that manipulate and/or transform data into other data, said data represented as physical quantities, e.g. such as electronic quantities, and/or said data representing the physical objects. The terms "computer", "processor", and "controller" should be expansively construed to cover any kind of electronic device with data processing capabilities, including, by way of non-limiting example, the inspection system presented in the current disclosure.

The operations in accordance with the teachings herein may be performed by a computer specially constructed for the desired purposes or by a general purpose computer specially configured for the desired purpose by a computer program stored in a non-transitory computer readable storage medium.

Embodiments of the presently disclosed subject matter are not described with reference to any particular programming language. It will be appreciated that a variety of programming languages may be used to implement the teachings of the presently disclosed subject matter as described herein.

It is appreciated that, unless specifically stated otherwise, certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable sub-combination.

Referring to FIG. 1, there is illustrated an exemplary workflow for specimen fabrication in accordance with certain embodiments of the presently disclosed subject matter. For purpose of illustration only, the following description is provided with respect to inspection of semiconductor wafers. Embodiments are applicable to other specimens and/or other operations providing defect-related information.

As illustrated, a wafer 110 can be produced via a fabrication process 130 in accordance with design data comprised in a design database storing unit 120. The design database storing unit 120 can be implemented as a separate, local or remote storage unit, or can be integrated with other tools usable during the fabrication process. By way of non-limiting example, the design data can include a computer automated design (CAD) library. Additionally or alternatively, the design data can be derivatives of data that is stored in the CAD library and/or can be presented in a format different than the data that is stored in the CAD library.

During the fabrication process, the wafer 110 can undergo one or more production processes producing respective production layers on the wafer. Inspection process 140 can include inspection, defect review or other metrology processes with regard to each or some of the wafer's production layers. The inspection process can operate in line with the fabrication process. Optionally, the inspection process or parts thereof can be provided after the fabrication process.

The inspection process 140 can be provided by one or more suitable wafer inspection tools. The inspection process 140 can identify locations of defects in the wafer 110, and can further process defect data in an effort to extract information that may be used to gain insight into the design process. By way of non-limiting example, the wafer 110 can be inspected using any combination of appropriate inspection methods (e.g. die-to-die, cell-to-cell, die-to-design, etc.).

The defects identified by the inspection process 140 can be classified by a classification process 150. As further detailed with reference to FIGS. 2-7, the classification process can be provided by a classification unit before or inline with the defect review. The inspection and/or classification processes (and/or parts thereof) can be provided in accordance with respective recipes.

The term "recipe" used in the specification should be expansively construed to cover any settings of parameters specifying operation of one or more respective tools (e.g. region-of-interest to be inspected, its location and repeat period on the wafer, the pixel size, beam current, charging conditions and image acquisition conditions, defect detection algorithm, image processing parameters, and/or others).

The term "design data" used in the specification should be expansively construed to cover any data indicative of hierarchical physical design (layout) of a specimen and/or data derived from the physical design (e.g. through complex simulation, geometric and Boolean operations, etc.). Design data can be provided in different formats as, by way of non-limiting example, GDSII format, OASIS format, etc. Design data specify structural elements of a certain design. A structural element can be constructed as geometrical shapes optionally combined with insertion of other structural elements. By way of non-limiting example, a given structural element can comprise one or more STRUCTURE elements inserted by means of SREF, AREF directives in GDSII format, or can comprise one or more CELL elements inserted by means of PLACEMENT and REPETITION (OASIS format).

Figure 2:
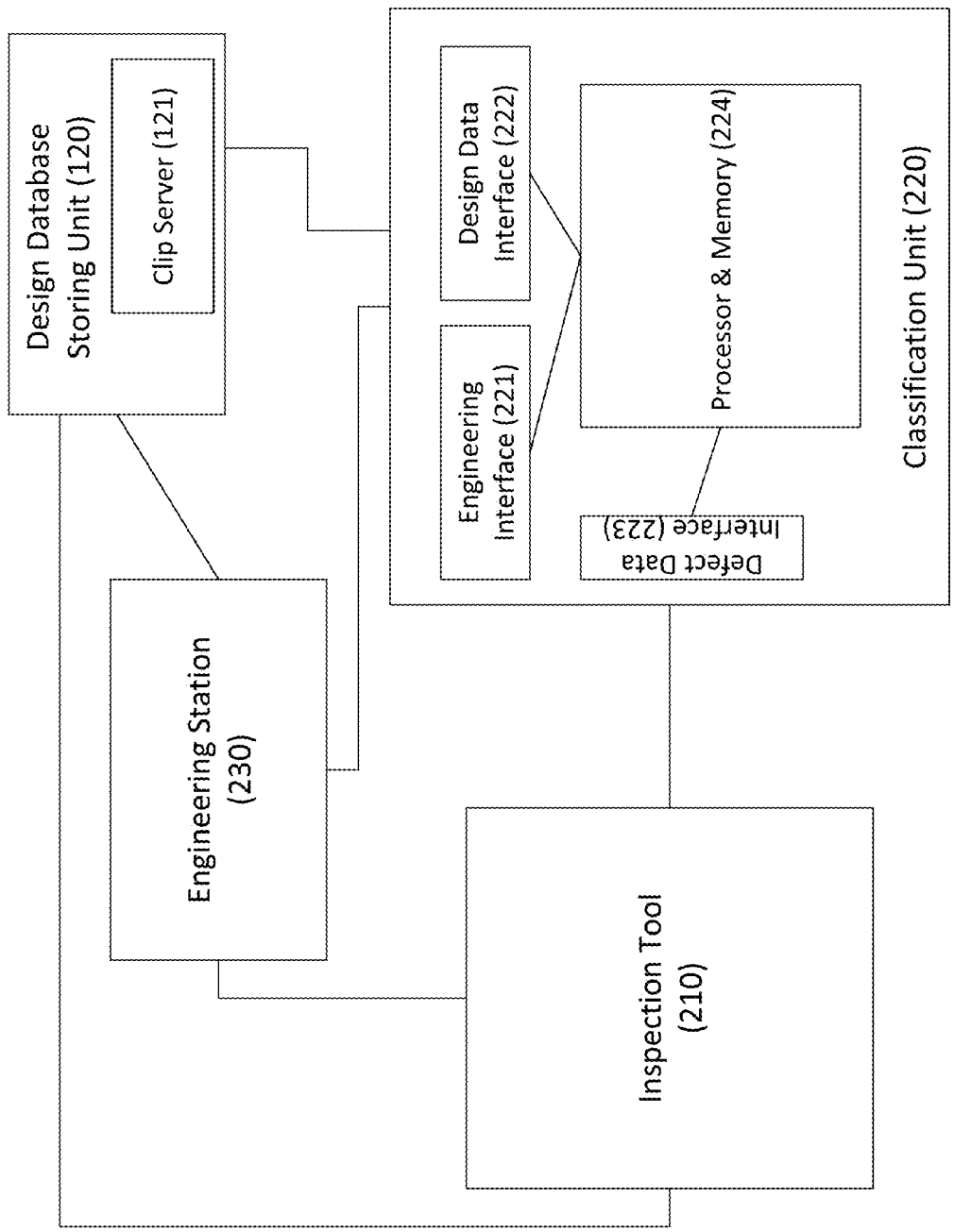
FIG. 2 illustrates a schematic functional diagram of an inspection system in accordance with certain embodiments of the presently disclosed subject matter.

Referring to FIG. 2, there is illustrated a generalized functional diagram of an inspection system configured to provide the defect classification process in accordance with certain embodiments of the presently disclosed subject matter.

The system comprises one or more inspection tools 210, an engineering station 230, a classification unit 220 and the design data storing unit 120 operatively coupled therebetween. The design data storing unit 120 comprises a clip server 121. Optionally, the clip server can be implemented as a stand-alone computer or its functions can be fully or partly integrated with, for example, the one or more inspection tools and/or with the engineering station. The classification unit 220 comprises a processor and memory unit 224 operatively coupled to an engineering interface 221 configured to enable data exchange with the engineering station, to a design data interface 222 configured to request and obtain data (including design data clips) from the design data storing unit 120, and a defect data interface 223 configured to enable data exchange with the one or more inspection tools. The processor and memory unit is further operative to store data necessary for operation of the classification unit 220, as well as to accommodate data received from the modules 221-223.

The classification unit can be implemented as a stand-alone tool to be used in conjunction with one or more inspection tools or its functions can, at least partly, be integrated with, for example, the one or more inspection tools and/or with the engineering station.

The functions of the system and parts thereof are further detailed with reference to FIGS. 3-7.

The presently disclosed subject matter is not bound by the specific architecture illustrated with reference to FIG. 2, equivalent and/or modified functionality can be consolidated or divided in another manner and can be implemented in any appropriate combination of software, firmware and hardware.

For purpose of illustration only, the following description is provided with respect to CAD-based attributes. Likewise, embodiments are applicable to other appropriate design data.

Figure 3:
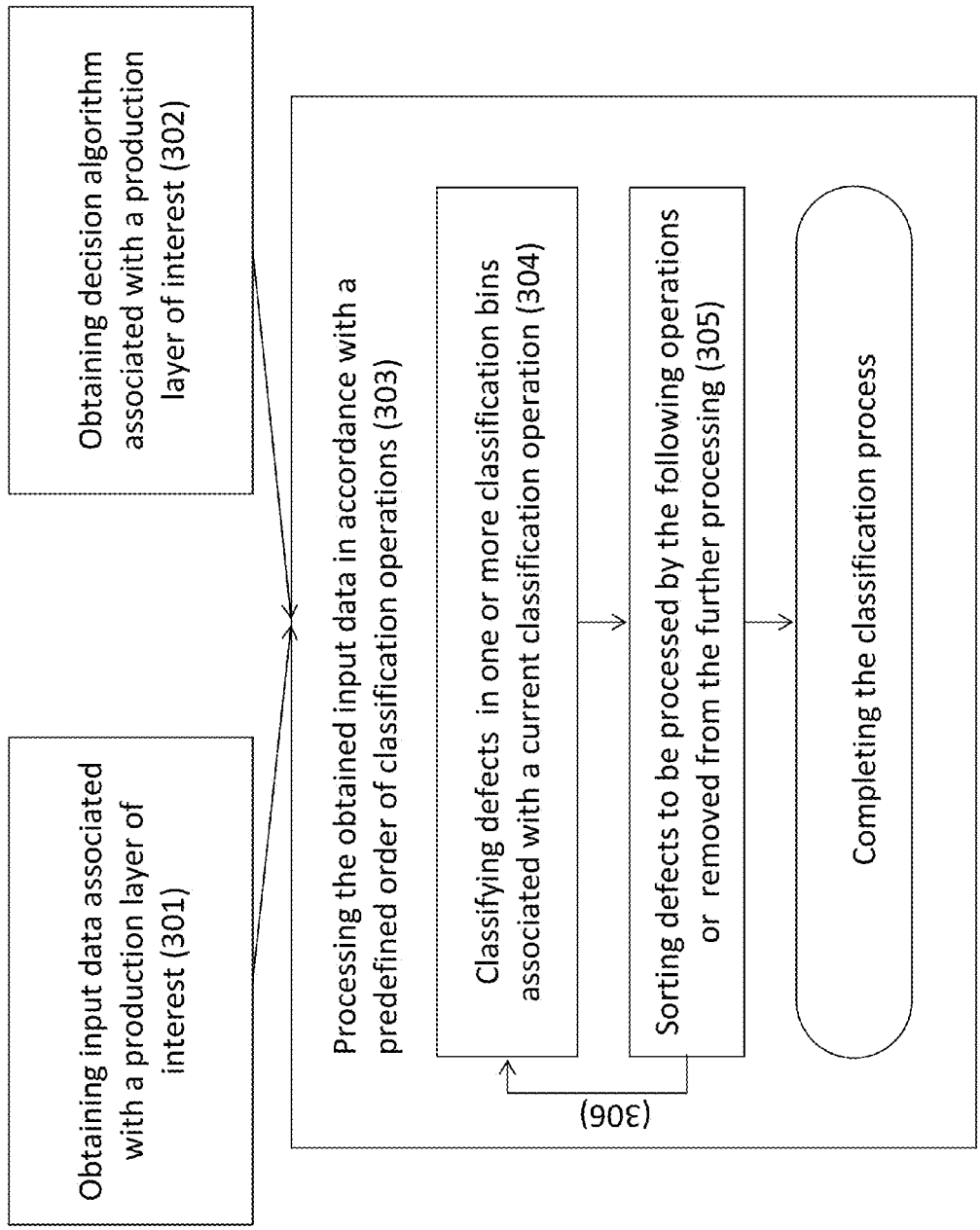
FIG. 3 illustrates a generalized flow chart of computerized classification of defects in accordance with certain embodiments of the presently disclosed subject matter.

Referring to FIG. 3, there is illustrated a generalized flow chart of the defect classification process in accordance with certain embodiments of the presently disclosed subject matter.

The classification unit obtains (301) input data associated with a certain production layer on the wafer and related to defects revealed in this production layer (referred to hereinafter as a production layer of interest). Sources and requirements for a list of input data can be specified by a user. Defect-related input data associated with the production layer of interest can comprise defect-indicative data, design-indicative data and combinations thereof. By way of non-limiting example, defect-related input data can comprise, for example, inspection results (e.g. defect locations in CAD coordinates or defects in inspection coordinates together with data indicative of design data alignment); defect images, design data and layers list (e.g. list of CAD layers usually includes CAD layers visible on the production layer of interest, but also can contain CAD layers corresponding to previous production layers and/or some CAD marker layers; design data can be in original GDS/OASIS format or converted into any other vector format); data indicative of design data alignment (e.g. CAD to Wafer Rotation and Offset extracted from CAD-based recipe or created from external knowledge, transformation matrix, etc.); patterns library(s) (e.g. contained in external binary files), rules for production of derived CAD layers (e.g. DRC scripts), etc.

The classification unit also obtains (302) a predefined decision algorithm. The decision algorithm can be obtained from the engineering station. By way of non-limiting example, the decision algorithm can be predefined by a user as will be further detailed with reference to FIG. 7. The same decision algorithm can be used for the production layer of interest of all respective wafers. Alternatively, for each next wafer the decision algorithm can be automatically adjusted based on the classification process of the previous wafer(s).

The classification unit further processes (303) the obtained input data associated with the production layer of interest and related to the revealed defects using the obtained decision algorithm. In accordance with certain embodiments of the currently presented subject matter, the decision algorithm pre-defines for the production layer of interest an order of classification operations and sorting the defects to the pre-defined bins. Each classification operation can be associated with one or more predefined bins, each bin of a predefined type. The type of a predefined bin can be selected as one of the following types: 1) classification bins corresponding to the defects finally classified by a current classification operation and thus removed from the further processing; 2) bins corresponding to the defects non-classified by a current classification operation, and removed from the further processing 303 as not matching the classification operations defined by the decision algorithm (e.g. cell-to-cell defects in a decision algorithm dedicated to classification of die-to-die defects only, etc.) 3) bins corresponding to defects recognized by a current operation as designated to a predefined further classification operation and thus to be processed when such predefined classification operation is executed; 4) bins corresponding to defects recognized by the current classification operation as designated to one of the following classification operations and thus to be processed by each next classification operation until further classified.

Optionally, the same defect can be sorted to more than one bin. By way of non-limiting example, a defect can be classified to a classification bin and also be sorted to a bin gathering certain defects for further statistical analyses.

Optionally, different classification operations can share the same classification bins (e.g. nuisance defects of different natures identified as nuisances by different classification operations can be put in one nuisance bin).

By way of non-limiting example, the order of classification operations and respective associated bins can be predefined using a decision tree template as will be further detailed with reference to FIGS. 4-6.

Thus, the classification operations are provided in accordance with a predefined order; at each current operation the classification unit classifies (304) the defects to one or more classification bins and sorts (305) the rest of the defects to be processed by one or more following classification operations or filtered out from the entire classification processing. During a following operation, the classification unit further classifies (304) defects and sorts (305) defects designated to be processed by one or more following classification operations or to be removed from the further processing. The process continues (306) until all defects are either classified, removed from a further processing (e.g. cell-to-cell defects in case of die-to-die defects classification) and/or stored for another classification processing (e.g. manual classification).

In certain embodiments the predefined order of the classification operations and bins associated therewith can be defined by different considerations. Some of the classification operations can be provided in parallel (e.g. classifying the same defects in accordance with different design rule checks (DRCs).

By way of non-limiting example, the order and bins can be defined such that the number of defects designated for processing by each next classification operation is decreased.

The order of operations and bins thereof can be further defined by increasing the amount of input data sources required for each next classification operation. By way of non-limiting example, merely defect attributes-based classification operations can be followed by classification operations based on defect attributes and defect images; can be further followed by classification operations requiring pattern libraries and/or other CAD data; can be further followed by operations requiring, in addition, DRC analyses; etc. Alternatively or additionally, the order of classification operations can be defined by number of defects required for classification processing. By way of non-limiting example, the operations requiring a large number of defects to be processed for classification decision (e.g. statistic-based classification) can precede the operations requiring less defects (e.g. classification based on defect attributes). By way of another non-limiting example, a classification operation requiring a large number of defects to be processed for classification decision can be at the end of the classification process, while preceding classification operations can sort the appropriate defects to the bins designated for processing by such classification operation (optionally, sorting certain defects to such operation can be provided in addition to sorting these defects to respective classification bin(s)).

The processing (303) can be provided in run-time mode. Optionally, the processing (303) can be provided offline, separately for each inspection results file.

By way of non-limiting example, the sequence of classification operations and the bins thereof can be predefined using a decision tree template. FIG. 4 illustrates a non-limiting schematic example of a decision tree template generated for computerized classification of defects in accordance with certain embodiments of the presently disclosed subject matter.

The illustrated decision tree can also be a part of more general classification/sorting recipe based on a template decision tree set per the production layer of interest. The defects to be processed by the classification operation 401 can be the defects non-classified by previous classification processing utilizing defect size & shape attributes, defect images, signature analysis, etc.

The classification operations in the illustrated decision tree are provided using design-based attributes.

Optionally, the classification unit calculates CAD attributes for each of the defects to be processed prior to the classification operations.

During the classification operation 401 (library match operation), each defect is analyzed on matching of its vicinity to any of the predefined library patterns. If such a match occurs, the defect is classified to one of the classification bins 410-411. If no match occurs, the defect is sorted for further processing by the classification operation 402.

The classification operation 402 provides classification by design attributes (CDA)—classification according to CAD layer and data-type belonginess of polygons in the vicinity of a defect. For each defect to be processed, the classification operation generates a dataset indicative of data-types and layers attributes of all polygons in the vicinity of the defect (e.g. each polygon in CAD file of GDS/OASIS format is characterized by layer number and data-type number). This generated dataset is compared with one or more predefined datasets comprising classification-related instructions associated with combinations of data-type and layer number attributes.

The predefined datasets can be predefined by a user when generating the decision algorithm, or can be generated by the operation 402 in accordance with a predefined user's setup.

In the illustrated non-limiting example, the generated dataset indicative of data-types and layers attributes of all polygons in the vicinity of defect to be processed by the operation 402 is analyzed on matching to four predefined datasets. If a certain defect corresponds to a first predefined dataset the operation 402 classifies it to classification bin 412. The defects corresponding to the second, third and fourth predefined datasets are sorted to be processed correspondingly by the operations 403,404,405. The rest of defects are sorted to be processed by the classification operation 406. The operations 403-405 (operations of design rule check (DRC) combined with classification by design attributes (CDA)) process the defects in order to check if they meet criteria predefined in respective design rules (DRC 1 for operation 403, DRC 2 for operation 404 and DRC 3 for operation 405). The classification by operations 403-405 is provided in accordance with correlation between the design rules and the revealed defects. Defects satisfying the respective rules are classified, accordingly, to classification bins 414, 416 and 418. The rest of defects are sorted to be processed by operation 406 (bins 415, 417 and 419 respectively). The operations 403-405 are configured to be provided in parallel.

The classification operation 406 provides design-based binning (DBB) to bins 420-421 for defects previously designated to bins 415, 417 and 419 and defects sorted by the operation 402 to be processed by the operation 406. A DBB bin is configured to group defects according to similarity of patterns in their vicinity. In contrary to a library match, the patterns used for DBB are not predefined. The defects sorted to DBB bins can be further sampled in accordance with a user policy.

By way of non-limiting example, the execution of the decision algorithm in accordance with the illustrated tree can be provided as follows:

CAD-based attributes can be calculated by the classification unit during an inspection scan;

Clips can be imported to the classification unit via run-time Clip Server;

CDA, DRC and library match calculations can be done during the inspection scan;

DBB for sampling can be done when the inspection scan is completed.

DRC analysis can be provided per clip. Among advantages of such an approach are the following: no need in special DRC station; no need in generation at DRC station derived CAD layer for each DRC rule; can apply sequence of DRC's; easy procedure of DRC script development: changes in parameters do not require recreation of new derived CAD layer.

Figure 4:
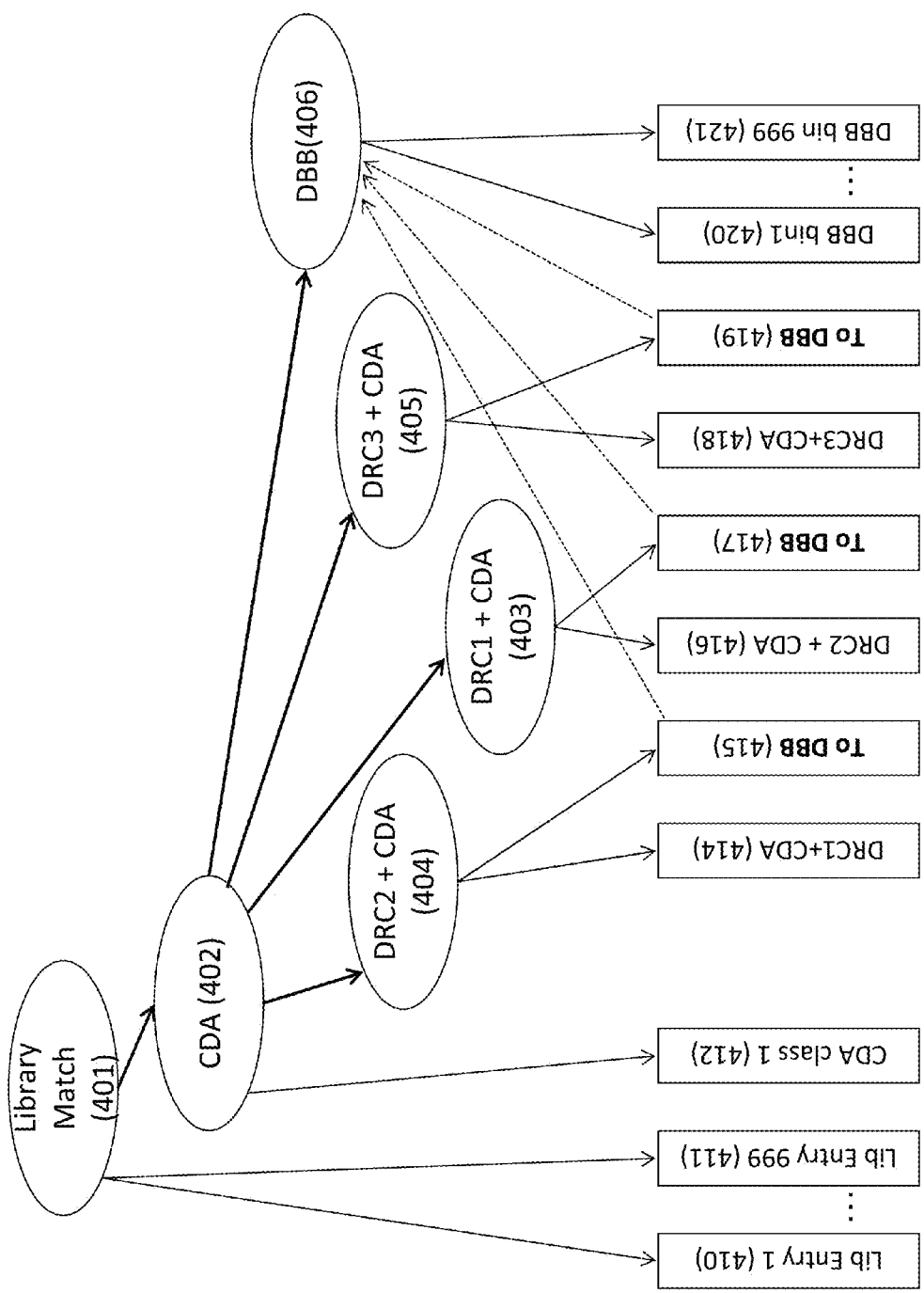
FIG. 4 illustrates a non-limiting schematic example of a decision tree template generated for computerized classification of defects in accordance with certain embodiments of the presently disclosed subject matter.

FIG. 5 illustrates a non-limiting example of an operations sequence table resulting from parsing the decision tree defined by the template in FIG. 4. At the start, each defect is initialized by initial class code (e.g. 10). Step K includes collecting defects with class code according to column "Input Class Code"; obtaining input parameters, running classification algorithm (column "Algorithm") over defects collected at the StepK and respective updating class codes of input defects before proceeding to Step K+1.

Figure 6:
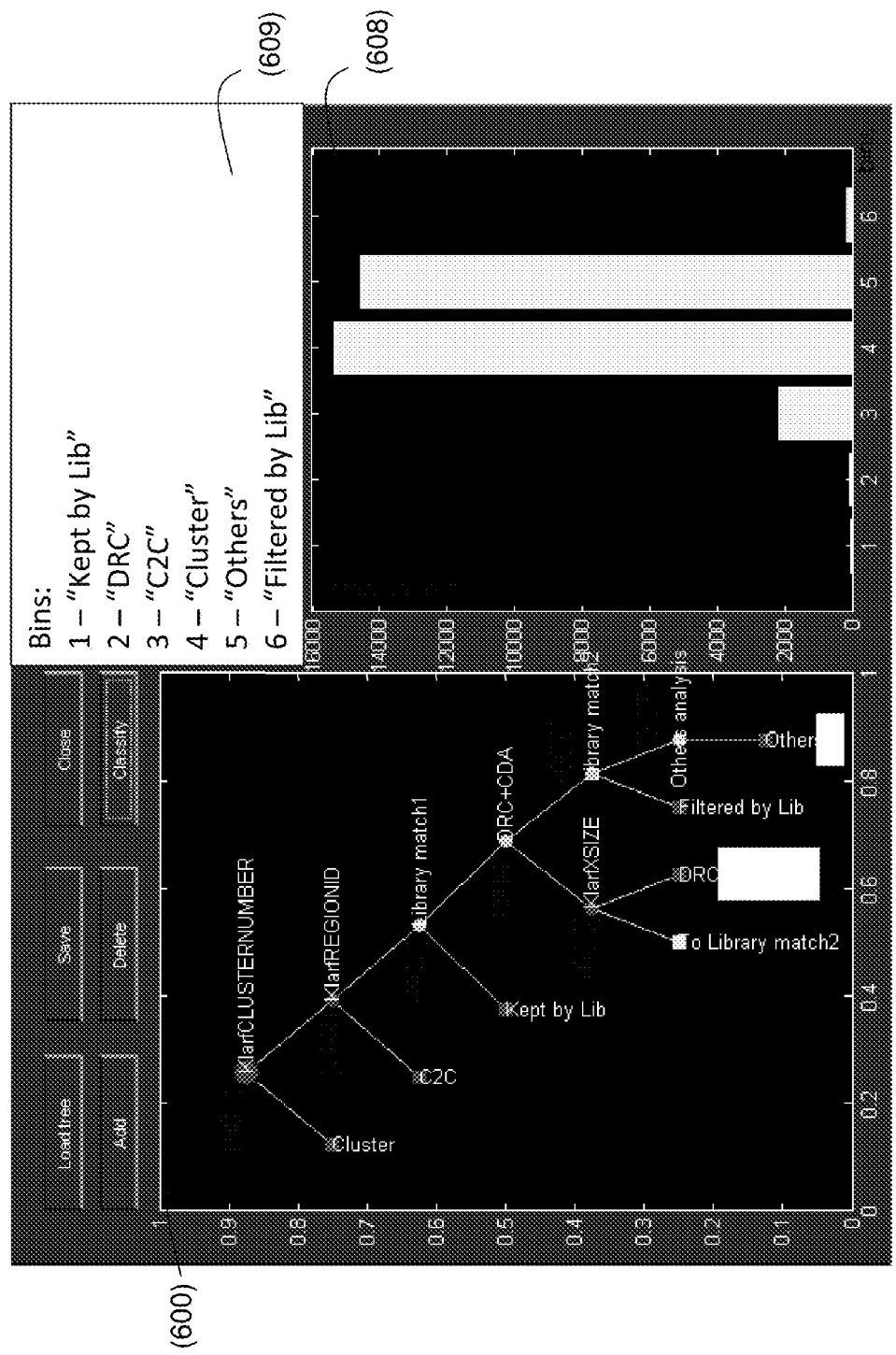
FIG. 6 illustrates a screenshot comprising another non-limiting schematic example of the decision tree template generated for computerized classification of defects in accordance with certain embodiments of the presently disclosed subject matter.

FIG. 6 illustrates a screenshot comprising another non-limiting schematic example of decision tree template 600 and respective results 608 of defect classification into predefined bins specified in a Table 609. In the illustrated decision tree template clustering classification operation 601 filters-out respective defects to bin "Cluster". Next classification operation 602 filters-out cell-to-cell defects to bin "C2C". The rest of the defects are processed by library match operation 603 classifying defects to "Kept by Lib" bin or sorting for processing by operation 604 providing design rule check combined with classification by design attribute (DRC+CDA). Operation 604 sorts the processed defects into defects to be processed by operation 605 and defects to be processed by operation 606. If defects processed by operation 605 match size criteria, they are sorted to "DRC" classification bin. Otherwise, the defects are sorted to be processed by operation 606. Library match operation 606 processes defects sorted thereto by operations 604 and 605, and classifies the matching defect to classification bin "Filtered by Lib". The rest of the defects are sorted to bin "Others".

Among advantages of certain embodiments of the currently disclosed subject matter is enabling run-time identifying and handling defects occurring as the result of the interactions between the design layout and the manufacturing process. On-line design rule check can be provided in the vicinity of each of the identified defects matching predefined criteria, while multiple design rule checks (DRCs) can be provided in a single run.

Figure 7:
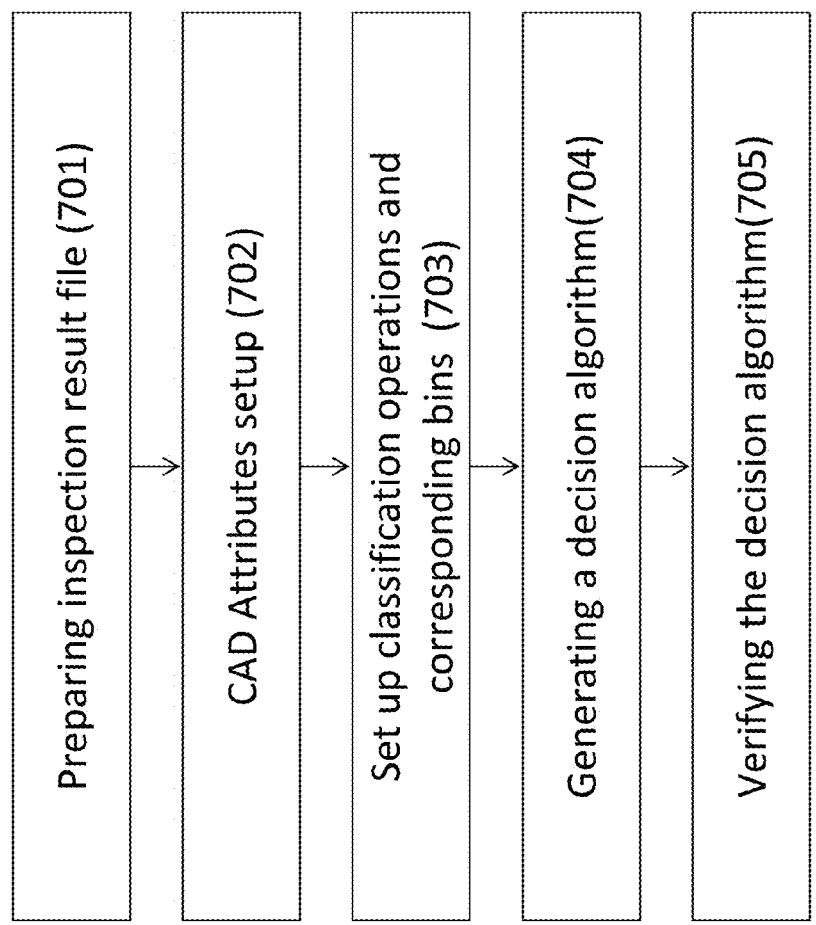
FIG. 7 illustrates a generalized flow chart of computerized generation of a decision algorithm in accordance with certain embodiments of the presently disclosed subject matter.

FIG. 7 illustrates a generalized flow chart of computerized generation of a decision algorithm in accordance with certain embodiments of the presently disclosed subject matter. Decision algorithm for a production layer of interest can be generated on the engineering station 230. A user can setup (702) CAD attributes to be used during classification processing. CAD attributes setup can include selection of CAD layers (e.g. list of CAD layers can include CAD layers visible on the production layer of interest, CAD layers corresponding to previous production layer, CAD marker layers, etc.), selection and/or generation of CAD patterns for library match operations, design check rules, etc. The user can further predefine the bins, setup (703) classification operations, the order thereof, and associate the bins with the classification operations. The engineering station automatically generates (704) the decision algorithm in accordance with the user's setup. The engineering station can further obtain (701) from inspection tool(s) inspection results (e.g. defects file) with classified defects (e.g. as DOI, false and nuisance defects). These data received from the inspection tool(s) can be used for verifying (705) the generated decision algorithm and adjusting the user's setup, if necessary.

In the provided specification, numerous specific details are set forth in order to provide a thorough understanding of the invention. However, it will be understood by those skilled in the art that the present invention can be practiced without these specific details. In other instances, well-known methods, procedures, components and circuits have not been described in detail so as not to obscure the present invention.

It will also be understood that the system according to the invention can be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

Those skilled in the art will readily appreciate that various modifications and changes can be applied to the embodiments as hereinbefore described without departing from its scope, defined in and by the appended claims.

The invention claimed is:

1. A computer-implemented method for classifying defects detected on a production layer of a specimen, the method comprising:

obtaining input data related to the detected defects;
processing the input data using a decision algorithm associated with the production layer and specifying two or more classification operations and a sequence thereof;
sorting processed defects in accordance with predefined bins, wherein each bin is associated with at least one classification operation specified by the decision algorithm, wherein the at least one classification operation specified by the decision algorithm sorts at least part of the processed defects to one or more classification bins to yield finally classified defects, and wherein each given classification operation specified by the decision algorithm, excluding the last classification operation in the sequence specified by the decision algorithm, sorts at least part of the processed defects to be processed by one or more of the classification operations following the given classification operation in the sequence specified by the decision algorithm; and
storing at least finally classified defects in a storage medium.

2. The method of claim 1 wherein the defects sorted by a current classification operation to be processed by one or more of the following classification operations are sorted to one or more bins associated with the current classification operation and selected from a group comprising:
bins corresponding to defects non-classified by a current classification operation, and removed from further processing as not matching the classification operations defined by the decision algorithm;
bins corresponding to defects recognized by a current operation as designated to a predefined further classification operation and thus to be processed when such predefined classification operation is executed; and
bins corresponding to defects recognized by the current classification operation as designated to one of the following classification operations and thus to be processed by each next classification operation until further classified.

3. The method of claim 1 wherein the same defect is sorted to more than one bin.

4. The method of claim 1 wherein at least one bin is associated with at least two classification operations.

5. The method of claim 1 wherein the input data comprise design-indicative data.

6. The method of claim 1 wherein at least one classification operation sorts the processed defects based on matching, for each defect, a dataset indicative of data-types and layers numbers attributes of all polygons in a vicinity of the defect to one or more predefined datasets comprising classification-related instructions associated with combinations of data-type and layer number attributes.

7. The method of claim 1 wherein at least one classification operation sorts the processed defects using a combination of design rule check (DRC) analyses with classification by design attributes (CDA).

8. The method of claim 1 wherein an order of classification operations is predefined in accordance with at least one of the following:
a. decreasing a number of defects designated for processing by each next classification operation;
b. increasing an amount of input data sources required for each next classification operation;
c. providing a classification operation requiring a large number of defects to be processed for classification decision before classification operations requiring less defects to be processed for classification decision; and d. providing a classification operation requiring a large number of defects to be processed for classification decision after classification operations requiring less defects to be processed for classification decision and configured to sort appropriate defects to be gathered for processing by the classification operation requiring a large number of defects to be processed for a classification decision.

9. The method of claim 1 wherein at least two classification operations substantially simultaneously sort the processed defects using design rule check (DRC) analyses, each such classification operation corresponding to a different design rule.

10. The method of claim 1 further comprising calculating, during an inspection scan, design attributes for each of the defects to be processed.

11. The method of claim 10 wherein any of CDA, DRC and library match calculations required for the classification operations are provided during the inspection scan.

12. The method of claim 10 wherein at least one classification operation comprising design-based binning is provided after the inspection scan.

13. An inspection system capable of classifying defects detected on a production layer of a specimen, the inspection system comprising:
a defect data interface configured to obtain defect-indicative data from the at least one inspection tool;
a design data interface configured to obtain design-indicative data from a first memory;
a second memory configured to store finally classified defects; and
a processor operatively coupled to the at least one inspection tool, the first memory, and the second memory, wherein the processor is configured to process the defect-indicative data and the design-indicative data using a decision algorithm associated with the production layer and specifying two or more classification operations and a sequence thereof; the processor is further configured to sort processed defects in accordance with predefined bins,
wherein each bin is associated with at least one classification operation specified by the decision algorithm;
wherein the at least one classification operation specified by the decision algorithm sorts at least part of the processed defects to one or more classification bins to yield finally classified defects; and
wherein each given classification operation, excluding the last classification operation in the sequence specified by the decision algorithm, sorts at least part of the processed defects to be processed by one or more of the classification operations following the given classification operation in the sequence specified by the decision algorithm.

14. The system of claim 13 wherein the defects sorted by a current classification operation to be processed by one or more of the following classification operations are sorted to one or more bins associated with the current classification operation and selected from a group comprising:
bins corresponding to defects non-classified by a current classification operation, and removed from the further processing as not matching the classification operations defined by the decision algorithm;
bins corresponding to defects recognized by a current operation as designated to a predefined further classification operation and thus to be processed when such predefined classification operation is executed; and bins corresponding to defects recognized by the current classification operation as designated to one of the following classification operations and thus to be processed by each next classification operation until further classified.

15. The system of claim 13 further configured to calculate, during a scan of the at least one inspection tool, design attributes for each of the defects to be processed.

16. The system of claim 15 further configured to provide any of CDA, DRC and library match calculations required for the classification operations during the scan of the at least one inspection tool.

17. The system of claim 16 further configured to provide at least one classification operation comprising design-based binning after the scan of the at least one inspection tool.

18. A processor operable in conjunction with an inspection system capable of classifying defects detected on a production layer of a specimen, the processor operatively coupled to a memory accessible by the processor and configured to store finally classified defects, wherein the processor is configured to process defect-indicative data and design-indicative data using a decision algorithm associated with the production layer and specifying two or more classification operations and a sequence thereof; the processor is further configured to sort processed defects in accordance with predefined bins;
   wherein each bin is associated with at least one classification operation specified by the decision algorithm;
   wherein the at least one classification operation specified by the decision algorithm sorts at least part of the processed defects to one or more classification bins to yield finally classified defects; and
   wherein each given classification operation, excluding the last classification operation in the sequence specified by the decision algorithm, sorts at least part of the processed defects to be processed by one or more of the classification operations following the given classification operation in the sequence specified by the decision algorithm.

19. The processor of claim 18 wherein the defects sorted by a current classification operation to be processed by one or more of the following classification operations are sorted to one or more bins associated with the current classification operation and selected from a group comprising:
   bins corresponding to defects non-classified by a current classification operation, and removed from the further processing as not matching the classification operations defined by the decision algorithm;
   bins corresponding to defects recognized by a current operation as designated to a predefined further classification operation and thus to be processed when such predefined classification operation is executed; and
   bins corresponding to defects recognized by the current classification operation as designated to one of the following classification operations and thus to be processed by each next classification operation until further classified.

20. The processor of claim 18 further configured to calculate, during an inspection scan, design attributes for each of the defects to be processed.

21. The processor of claim 20 further configured to provide any of CDA, DRC and library match calculations required for the classification operations during the inspection scan.

22. The processor of claim 21 further configured to provide at least one classification operation comprising design-based binning after the inspection scan.

* * * * *